(12) United States Patent
Velander et al.

(10) Patent No.: US 12,341,442 B2
(45) Date of Patent: Jun. 24, 2025

(54) VOLTAGE SOURCE CONVERTER AND A METHOD FOR OPERATION THEREOF

(71) Applicant: ALSTOM Holdings, Saint-Ouen-sur-Seine (FR)

(72) Inventors: Erik Velander, Västerås (SE); Magnus Jansson, Kvicksund (SE); Johnny Holmberg, Hallstahammar (SE)

(73) Assignee: ALSTOM Holdings, Saint-Ouen-sur-Seine (FR)

( * ) Notice: Subject to any disclaimer, the term of this patent is extended or adjusted under 35 U.S.C. 154(b) by 43 days.

(21) Appl. No.: 18/573,039

(22) PCT Filed: Jun. 15, 2022

(86) PCT No.: PCT/EP2022/066259
§ 371 (c)(1),
(2) Date: Dec. 21, 2023

(87) PCT Pub. No.: WO2022/268594
PCT Pub. Date: Dec. 29, 2022

(65) Prior Publication Data
US 2024/0291400 A1    Aug. 29, 2024

(30) Foreign Application Priority Data
Jun. 23, 2021   (SE) .................... 2150810-6

(51) Int. Cl.
*H02M 7/5387* (2007.01)
*H02M 1/088* (2006.01)
(Continued)

(52) U.S. Cl.
CPC ....... *H02M 7/53873* (2013.01); *H02M 1/088* (2013.01); *H02M 7/219* (2013.01); *B61C 3/02* (2013.01); *H02M 1/325* (2021.05)

(58) Field of Classification Search
CPC .. H02M 7/53873; H02M 1/088; H02M 7/219; H02M 1/325; B61C 3/02
See application file for complete search history.

(56) References Cited

U.S. PATENT DOCUMENTS

| | | | |
|---|---|---|---|
| 12,267,011 B2 * | 4/2025 | Cattani | H02M 3/158 |
| 2014/0133186 A1 * | 5/2014 | Balakrishnan | H01L 23/48 |
| | | | 363/17 |

(Continued)

FOREIGN PATENT DOCUMENTS

| | | |
|---|---|---|
| EP | 3236567 A1 | 10/2017 |
| EP | 2733740 A2 | 6/2020 |

(Continued)

OTHER PUBLICATIONS

International Search Report and Written Opinion issued by the ISA for priority International Application No. PCT/EP2022/066259, mailed Sep. 28, 2022.

(Continued)

*Primary Examiner* — Jared Fureman
*Assistant Examiner* — Esayas G Yeshaw
(74) *Attorney, Agent, or Firm* — Renner, Otto, Boisselle & Sklar, LLP.

(57) ABSTRACT

A voltage source converter includes two half bridges each having two current valves connected in series to be connected to opposite poles of a DC source/load. A gate drive unit controls a semiconductor device of a current valve. An arrangement carries out voltage measurements for providing a value of DC voltage between the opposite poles. A voltage divider connected across the two current valves measures DC voltage between opposite poles and each voltage divider has an output connected to processing parts delivering a digital signal representing a value of the DC voltage between the poles. Two gate drive units send a digital signal to a calculating unit to carry out a quality estimation of the (Continued)

digital signals and to calculate a DC voltage value from the signals while giving each signal a weight corresponding to the quality value adhered thereto and then forming a weighted average value.

15 Claims, 5 Drawing Sheets

(51) Int. Cl.
*H02M 7/219* (2006.01)
*B61C 3/02* (2006.01)
*H02M 1/32* (2007.01)

(56) References Cited

U.S. PATENT DOCUMENTS

| | | | |
|---|---|---|---|
| 2021/0408930 A1* | 12/2021 | Löfgren | B60L 50/16 |
| 2024/0291386 A1* | 8/2024 | Stach | H02M 3/1584 |
| 2024/0364225 A1* | 10/2024 | Kim | H02M 1/0032 |

FOREIGN PATENT DOCUMENTS

| | | |
|---|---|---|
| WO | 2007059985 A1 | 5/2007 |
| WO | 2020104204 A1 | 5/2020 |

OTHER PUBLICATIONS

Singh, Balraj et al., "Averaging Methods for Experimental Measurements", IAEA-ICTP Workshop, Aug. 22, 2016 through Sep. 2, 2016.

* cited by examiner

VOLTAGE SOURCE CONVERTER AND A METHOD FOR OPERATION THEREOF

This application is a national phase of International Application No. PCT/EP2022/066259 filed Jun. 15, 2022, which claims priority to Sweden Application No. 2150810-6 filed Jun. 23, 2021, each of which is hereby incorporated herein by reference in its entirety.

TECHNICAL FIELD OF THE INVENTION

The present invention relates to a voltage source converter comprising
- at least two half bridges each having two current valves connected in series and configured to be connected to opposite poles of a DC source/load on a first side of the converter, each said current valve comprising a semiconductor device of turn-off type and a rectifying diode connected in anti-parallel therewith, a midpoint of the half bridge between the two current valves being configured to be connected to one of a) an AC load/source and b) a DC load/source on a second side of the converter,
- for each half bridge a gate drive unit having two gate drive members each comprising a logic device and a gate drive stage configured to control the semiconductor device of a current valve each to turn on and off according to control signals from a converter control device, and
- a said converter control device configured to send control signals to said gate drive members for controlling the operation of the converter according to a Pulse Width Modulation pattern for creating for a) on said second side an AC fundamental voltage and current and for b) on said second side a DC voltage and current, each gate drive unit including an arrangement configured to carry out voltage measurements for providing a value of the DC voltage between said opposite poles to be used by the converter control device to calculate control signals to be sent to the gate drive units, each said arrangement comprising a voltage divider connected across the two current valves of the respective half bridge so as to measure the entire DC voltage between said opposite poles, each voltage divider having an output connected to processing parts delivering a digital signal representing a value of the DC voltage between said opposite poles.

The invention is not restricted to any particular use of such a converter, but the use thereof in a track-bound vehicle, such as a rail vehicle, will in some parts of this disclosure be explained for eliminating the invention but accordingly not restrict the invention to that application.

Such a converter is used for converting a direct voltage on said first side to an alternating voltage or vice versa for different purposes or to a direct voltage of another magnitude when being a DC/DC converter. Thus, either the second side is considered to be the load and the first DC side the source as for a motor converter or conversely as for a line converter when the second side is an AC side. The invention is not restricted to any number of half bridges, although three is most common in case of the second side being connected to an AC load, neither is the invention restricted to any particular levels of such voltages or electric power to be fed through the converter.

Figure 1:
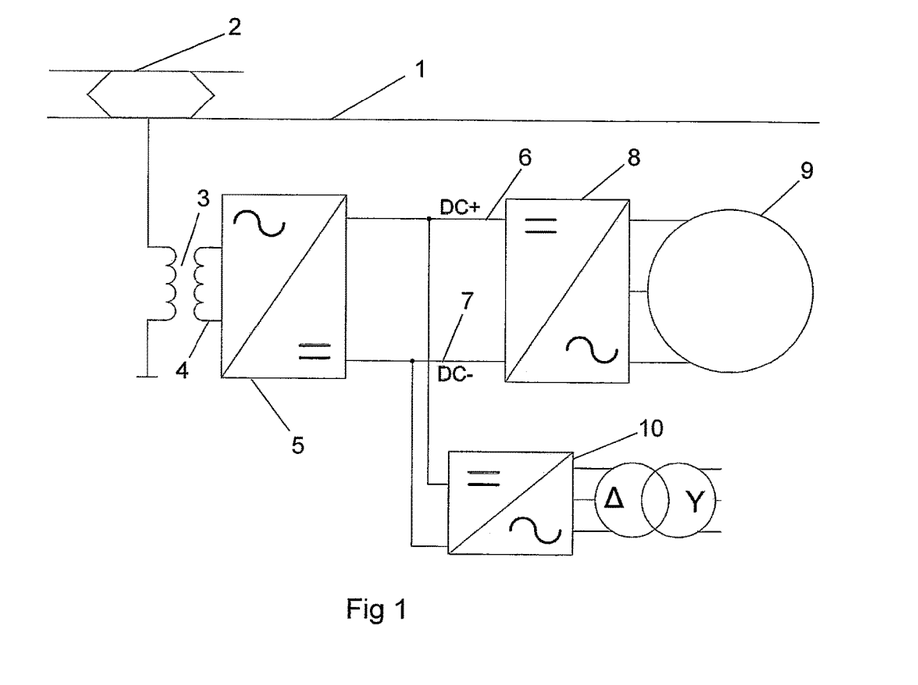
FIG. 1 is a very schematic view illustrating how different types of converters of the type to which the present invention is directed may be arranged and controlled in a track-bound vehicle.

The at least two half bridges may belong to any of the voltage source converters included in the track-bound vehicle 1 shown in FIG. 1 where it is schematically illustrated how electric power may be fed to the vehicle 1 from an AC-supply line 2 and used in the vehicle. The vehicle is configured to move along the AC-supply line 2, which acts as an AC-source when transferring electric power to the vehicle and an AC-load when receiving electric power from the vehicle when braking. The AC-supply line 2 may for example carry a single phase alternating voltage of 15 kV and 16⅔ Hz (Sweden, Germany etc.) or 25 kV and 50 Hz (Denmark, China, India etc.). The vehicle has a transformer 3 for transforming the voltage from the supply line 2 to a suitable level. A secondary winding 4 of the transformer is connected to a line converter 5 for delivering a direct voltage of for example 0.8-3 kV on the output thereof. The two poles 6, 7 of that direct voltage are connected to a machine converter module 8 including a voltage source converter being controlled to deliver a three phase alternating voltage on the output thereof to a traction motor 9 in the form of an electric machine for driving the vehicle. The two direct voltage poles 6, 7 are also connected to the input of an auxiliary converter module 10 including a voltage source converter controlled to deliver a three phase alternating voltage on the output thereof to a distribution network to sockets arranged in the track-bound vehicle such as for connection of computers, and to lightening, heating and other appliances.

In case of a direct current fed track-bound vehicle the supply line will instead be a DC-supply line, and the transformer and the line converter module shown in FIG. 1 will then normally be replaced by a filter.

It is of vital importance to have reliable data of the direct voltage across said poles connected to an above voltage source converter, since these data are used for voltage level control and over voltage protection. Faulty such data can cause e.g. explosion of a DC-link capacitor connecting these poles due to over voltage.

BACKGROUND ART

It is known to have two physical DC voltage sensors connected to said two poles for obtaining the desired redundancy and reliability of DC voltage values measured. However, the cost, need of space and weight of each such sensor are considerable factors desired to be avoided as far as possible.

Furthermore, WO 2020/104204 A1 discloses a voltage source converter according to the introduction in which each gate drive unit includes an arrangement configured to carry out voltage measurements for providing a value of the DC voltage between the opposite poles of a DC source/load. DC voltage values may in such a voltage source converter be delivered through such an arrangement, accordingly without the use of a physical voltage sensor. However, the accuracy of the DC voltage values provided through such an arrangement is in that known voltage source converter not always as high as of a said physical voltage sensor functioning adequately.

SUMMARY OF THE INVENTION

The object of the present invention is to provide a voltage source converter of the type defined in the introduction being improved in at least some aspect with respect to known such converters as well as a method for operation of such a voltage source converter.

This object is with respect to the voltage source converter obtained by providing such a converter with the features listed in the characterizing part of appended patent claim 1.

Thus, by providing the voltage source converter with a calculating unit receiving digital signals representing values of the DC voltage between said opposite poles from at least two gate drive units of the converter, and the fact that the calculating unit is configured to carry out a quality estimation of the digital signals received from these at least two gate drive units so as to give them an individual quality value and to calculate a said DC voltage value to be used by the converter control device from these signals while giving each signal a weight corresponding to the quality value adhered thereto and then forming a weighted average value, a reliable DC voltage value may be obtained through the voltage source converter without any physical voltage sensor. This means that redundancy can be obtained by combining a physical voltage sensor with the voltage measurement disclosed. This means that the physical voltage sensor can be supervised, and protected actions can be performed in order to avoid failures such as capacitor explosions without having more components in the system.

As a result, the costs for buying, mounting and maintaining components can be kept low. In addition, the failure rate, weight and space envelope of the system can be lowered. It is also within the invention to omit a physical voltage sensor and only use a DC voltage measurement using said digital signals from the gate drive units, although said redundancy would mostly be crucial.

By using digital signals from at least two gate drive units and giving them an individual quality value an acceptable reliability of the DC voltage value delivered may be obtained. The presence of parasitic inductances in voltage source converters may not be avoided, and due to rapid current changes when the semiconductor devices are turned on and off unwanted "bumps" in the voltage measured by said arrangement will occur. The influence thereof upon the DC voltage value delivered may be minimized in a voltage source converter according to the invention. By the quality estimation it is estimated how accurate a digital signal represents a true voltage value and it is given a quality value being the higher the higher such accuracy is estimated to be. The higher such a quality value is the more influence shall it have on the result when calculating the voltage value. The signal may be given a weight of 1 when the quality value thereof is high and it is to be given full consideration when determining the voltage value and a weight of 0 when the quality value thereof is that low that it has to be not considered at all.

According to an embodiment of the invention the calculating unit is configured to carry out said quality estimation by forming a time differential variable of each individual said digital signal and giving it a quality value being the lower the higher the absolute value of this differential variable is. This may be an efficient way to get rid of said bumps, the presence of which will result in increased absolute values of a said differential variable, since such bumps will increase the voltage value measured when turning the semiconductor device on and lower this value when turning the semiconductor device off. However, would a measurement take place at the top or bottom of a bump the differential variable will be zero and the quality value high. Thus, it is required that the duration of a bump is short for getting a high absolute value of a differential variable of a digital signal.

According to another embodiment of the invention each gate drive unit set a zero quality to its DC voltage value measured when the semiconductor device thereof or a semiconductor device of any gate drive unit is switched. The latest available non-zero quality value thereof may then instead be used. At the moment of switching and directly thereafter, within some us after the switching, the disturbance of the DC voltage value will be that high that it shall not be used for calculating a reliable DC voltage value.

According to a further development of the embodiment last mentioned the calculating unit is configured to compare each said absolute value with a predetermined value and give the digital signal associated with that absolute value a zero weight when said absolute value exceeds said predetermined value and then not consider this digital signal when calculating said DC voltage value. It may by this be avoided to consider digital signals clearly not giving a correct view of the value of the DC voltage existing.

According to another embodiment of the invention the voltage source converter comprises at least three said half bridges with gate drive units configured to send a said digital signal representing a value of the DC voltage between said opposite poles to the calculating unit, and the calculating unit is configured to carry out said quality estimation by first forming a mean value of the digital signals from these at least three gate drive units, then compare the value of each signal with said mean value and finally give each signal a quality value and by that a weight when combining the signals depending upon the magnitude of the difference of the value of the signal and said mean value. When having at least three digital signals a DC voltage value may accurately be delivered by forming a said mean value and comparing each signal therewith.

According to another embodiment of the invention the second side is an AC side and the voltage source converter comprises three said half bridges each having a said gate drive unit configured to create a three-phase AC fundamental voltage and current on said AC side.

According to another embodiment of the invention said calculating unit comprises a neural network trained with said digital signals from said gate drive units while comparing them with a true DC voltage measured between said opposite poles during a training phase of the converter before operation thereof, and the calculating unit is configured to use an algorithm of the trained network to determine a said individual quality value of each said digital signal for the calculation of said DC voltage value by combining said digital signals. By including a said trained network in the calculating unit and use an algorithm thereof to determine a said individual quality value of each said digital signal bumps and other irregularities of the signals may be detected and removed when combining the signals to a DC voltage value.

According to another embodiment of the invention the voltage source converter comprises a said half bridge having a resistor connected in parallel with one of the valves so as to act as a brake chopper, and the calculating unit is configured to involve the digital signal delivered by the gate drive unit of this half bridge when calculating said DC voltage value. Also the gate drive unit of a brake chopper half bridge may be used to calculate said DC voltage value making it possible to increase the number of digital signals used for said calculation and by that the accuracy of the calculation.

According to another embodiment of the invention the voltage source converter comprises a DC voltage sensor configured to be connected to the two poles of said DC source/load for measuring the DC voltage between these poles, and the converter comprises a member configured to compare the DC voltage value calculated by the calculating unit with data of the DC voltage sensor so as to detect malfunction of said sensor. The redundancy obtained by this makes it possible to detect a failure of the current sensor for carrying out protective action in the converter control device.

According to another embodiment of the invention the calculating unit is included in the converter control device.

According to another embodiment of the invention the semiconductor devices are IGBTs (Insulated Gate Bipolar Transistors) or MOSFETs (Metal Oxide Semiconductor Field Effect Transistors).

The invention also relates to a method of operating a voltage source converter according the appended independent method claim. The advantages of such a method and possible embodiments thereof appear clearly from the above discussion of the voltage source converter according to the invention.

The invention also relates to a firmware product, a computer program product, an electronic converter control unit and a track-bound vehicle according to the appended claims directed thereto.

Further advantages as well as advantageous features of the invention will appear from the following description of embodiments of the invention.

BRIEF DESCRIPTION OF THE DRAWINGS

With reference to the appended drawings, below follows a specific description of embodiments of the invention cited as examples. In the drawings.

DETAILED DESCRIPTION OF EMBODIMENTS OF THE INVENTION

Figure 2:
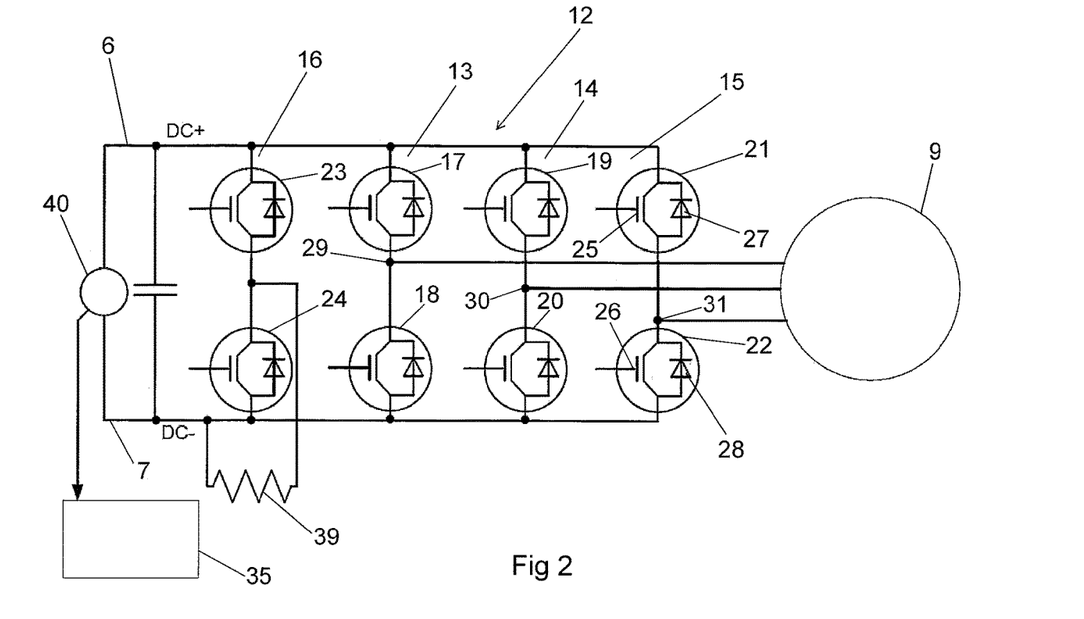
FIG. 2 is a schematic view of a voltage source converter to which the present invention may be applied.

FIG. 2 is a schematic view in the form of a circuit diagram of a voltage source converter 12 to which the present invention may be applied. This voltage source converter has four half bridges 12-16 each having two current valves 17-24 connected in series and configured to be connected to opposite poles 6, 7 of a DC source/load on a first side of the converter, in which each current valve comprises a semiconductor device 25, 26 of turn-off type and a rectifying diode 27, 28 connected in anti-parallel therewith. Turn-off types semiconductor devices are in this disclosure defined as semiconductor devices acting as IGBTs and MOSFETs by being able to be controlled to be abruptly turned off enabling creating of a Pulse Width Modulation pattern thereby. Mid-points 29-31 of three of the half bridges 13-15 between the two current valves form on the second side of the converter an AC side and are configured to be connected to an AC source/load in the form of a traction motor 9. Each half bridge has a gate drive unit 32 not shown in this figure, but in FIG. 3 and having two gate drive members 33, 34 each comprising a logic device and a gate drive stage configured to control the semiconductor device 25, 26 of a current valve 21, 22 each to turn on and off according to control signals from a converter control device for operating the converter according to a Pulse Width Modulation pattern for creating a three phase AC fundamental voltage and current on said AC side. Each gate drive unit 32 includes an arrangement 36 configured to carry out voltage measurements for providing a value of the DC voltage between said opposite poles 6, 7 to be used by the converter control device 35 to calculate and send control signals to the gate drive unit. Each such arrangement comprises a voltage divider 37 connected across the two current valves 21, 22 of the respective half bridge so as to measure the entire DC voltage between the opposite pole 6, 7. Each such voltage divider has an output connected to processing parts 38 delivering a digital signal representing a value of the DC voltage between the opposite poles.

It is shown in FIG. 2 how a fourth half bridge 16 has a resistor 39 connected in parallel with one 24 of the valves so as to act as a brake chopper, in which excessive energy in the DC source/load, such as in a DC-supply line, may be burned to protect the converter from overvoltage or energy coming from the traction motor at braking may be burned when no feedback possibilities are possible, e.g. when the line voltage is higher than the acceptable level, and this is done by controlling the semiconductor device of the upper current valve 23 to turn on and off.

The voltage source converter has also a DC voltage sensor 40 connected to the two poles 6, 7 of the DC source/load for measuring the DC voltage between these poles and sending information thereabout to the converter control device. This sensor is used to measure said DC voltage to protect the system from overvoltage. Furthermore, in case of a voltage source converter in the form of a line converter this uses the DC voltage value measured to control the DC voltage, and in case of a motor control converter the DC voltage data is needed in order to control the motor with the right torque and speed.

Obviously it is very important that the system always is aware of a correct value of said DC voltage. This may be achieved by obtaining redundancy by having two said voltage sensors, but that would add the disadvantages mentioned above. This is the reason for delivering a value of the DC voltage by the voltage measurement carried out through gate drive units of the different half bridges. Such voltage measurements may be a compliment to a physical voltage sensor for obtaining redundancy or in some cases even make it without such a sensor. In order to achieve a high accuracy of such a voltage measurement the present invention considers possible faults in the digital signal delivered by the gate drive unit 32 to the converter control device, which may for instance occur in the form of "bumps" due to the switching of the semiconductor devices. The reason for this is the parasitic inductances 50-53 in the circuit schematically illustrated in FIG. 4 for a half bridge of the converter. When the power semiconductor devices are turned on and off the current changes rapidly and this change will cause an induced voltage which can be expressed as $$u = L\frac{di}{dt}.$$

Figure 5:
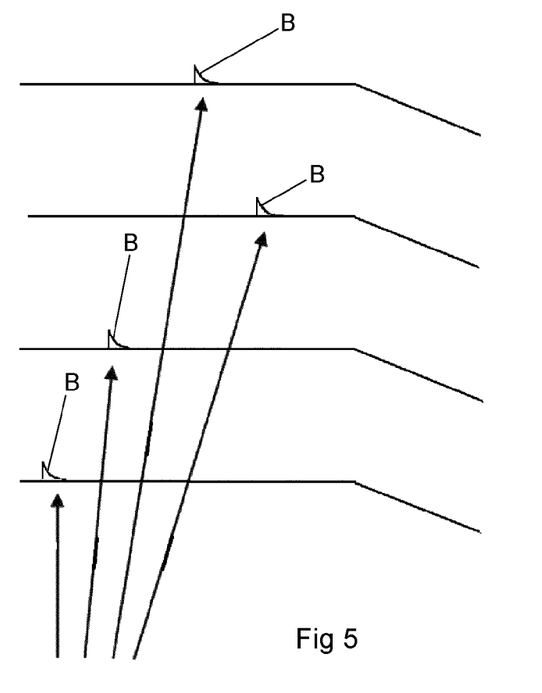
FIG. 5 shows graphs illustrating digital signals representing DC voltage values from four gate drive units in a voltage source converter according to FIG. 2.

This induced voltage will be added to expressed as the steady-state value of the DC voltage as shown in FIG. 5 for the four gate drive units belonging to the different half bridges of the converter shown in FIG. 2. It is shown how bumps B emanating from said switchings have a considerable magnitude.

In the converter according to the present invention a calculating unit 54 included in the converter control device 35 is configured to receive a said digital signal from at least two gate drive units of the converter and to carry out a quality estimation of these digital signals so as to give them an individual quality value and to calculate a DC voltage value to be used by the converter control device from these signals while giving each signal a weight corresponding to the quality value adhered thereto and then combining the signals. Such quality estimation may take place by forming a time differential variable of each individual digital signal and giving it a quality value being the lower the higher the absolute value of this differential coefficient is. The calculating unit may then compare each said absolute value with a predetermined value and give the digital signal associated with that absolute value a zero weight when the absolute value exceeds the predetermined value and then not consider this digital signal when calculating the DC voltage value. Voltage changes due to the presence of parasitic inductances and rapid current changes due to switching may by this be given a zero weight. Would all quality estimation values be low, old values can be used instead.

Figure 6:
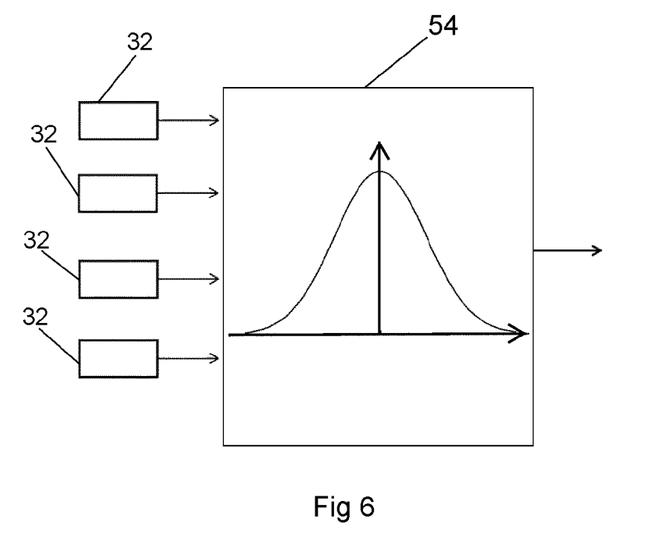
FIG. 6 is a simplified view illustrating the function of the calculating unit in a voltage source converter according to an embodiment of the invention.

FIG. 6 illustrates schematically an embodiment in which said digital signals from four gate drive units 32 arrives to the calculating unit 54, which here is configured to carry out the quality estimation by forming a mean value of the digital signals, compare the value of each signal with said mean value and give each signal a quality value and by that a weight when combining the signals depending upon the magnitude of the difference of the value of the signal and said mean value. Would in such a case one signal differ substantially from the other signals this may be removed from consideration or quality estimation value thereof be set low depending on the size of the deviation, and a reliable value of the DC voltage may be delivered.

Figure 7:
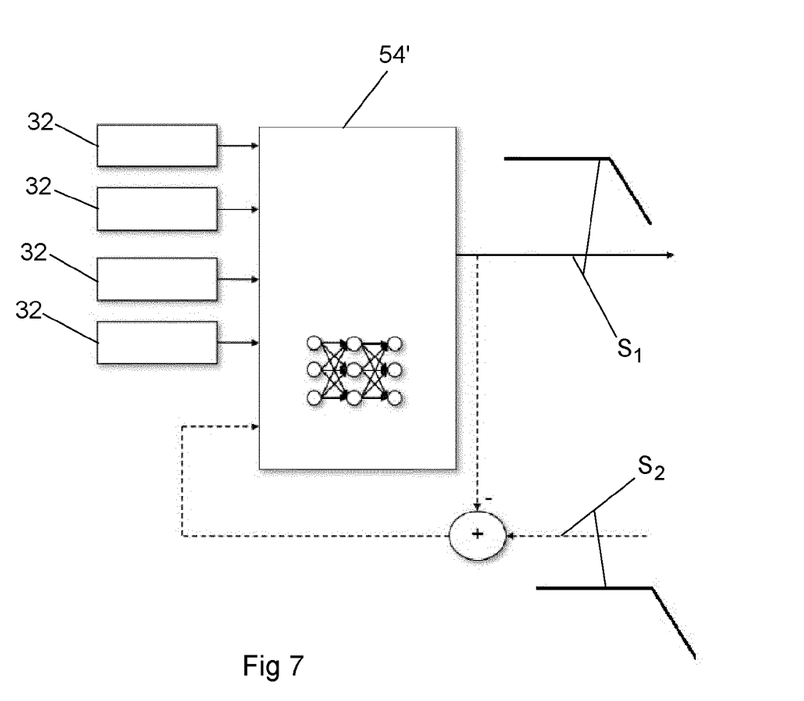
FIG. 7 illustrates an alternative way of functioning of a calculating unit in a voltage source converter according to the invention.

FIG. 7 illustrates schematically another embodiment of the invention in which the gate drive units are connected to a calculating unit 54' having a neural network trained with digital signals from the gate drive units 32 while comparing them with a true DC voltage measured between opposite poles of a DC source/load during a training phase of the converter before operation thereof. The signal $s_1$ produced by the network from the signals from the gate drive units 32 is during the training phase compared with the true DC voltage signal $s_2$ and the algorithm of the network adapted to reduce the deviation of these two signals. The calculating unit 54' is then during operation of the converter configured to use an algorithm of the trained network to determine an individual quality value of each digital signal from the gate drive units for calculation of the DC voltage value by combining these digital signals.

A member 55 (see FIG. 3) may be arranged to compare the DC voltage value calculated by the calculating unit 54 with data of a DC voltage sensor 40 for determining the functionality of that sensor.

Figure 3:
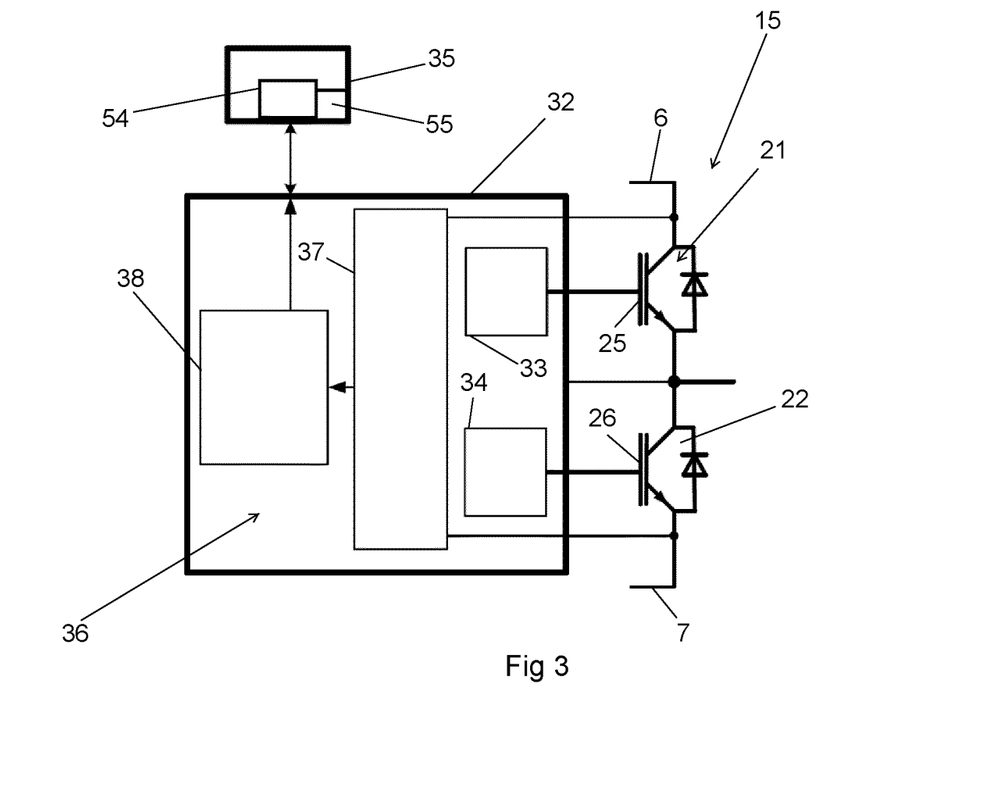
FIG. 3 is a very schematic view illustrating the principles of voltage measuring in a half bridge in a voltage source converter according to the invention.
Figure 4:
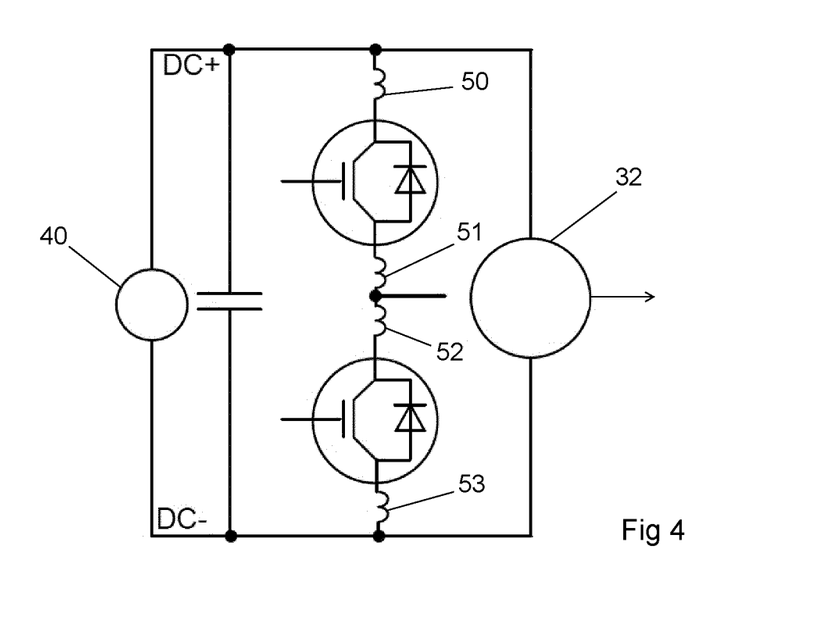
FIG. 4 is a schematic view of a half bridge in a voltage source converter illustrating parasitic inductances therein.
Figure 8:
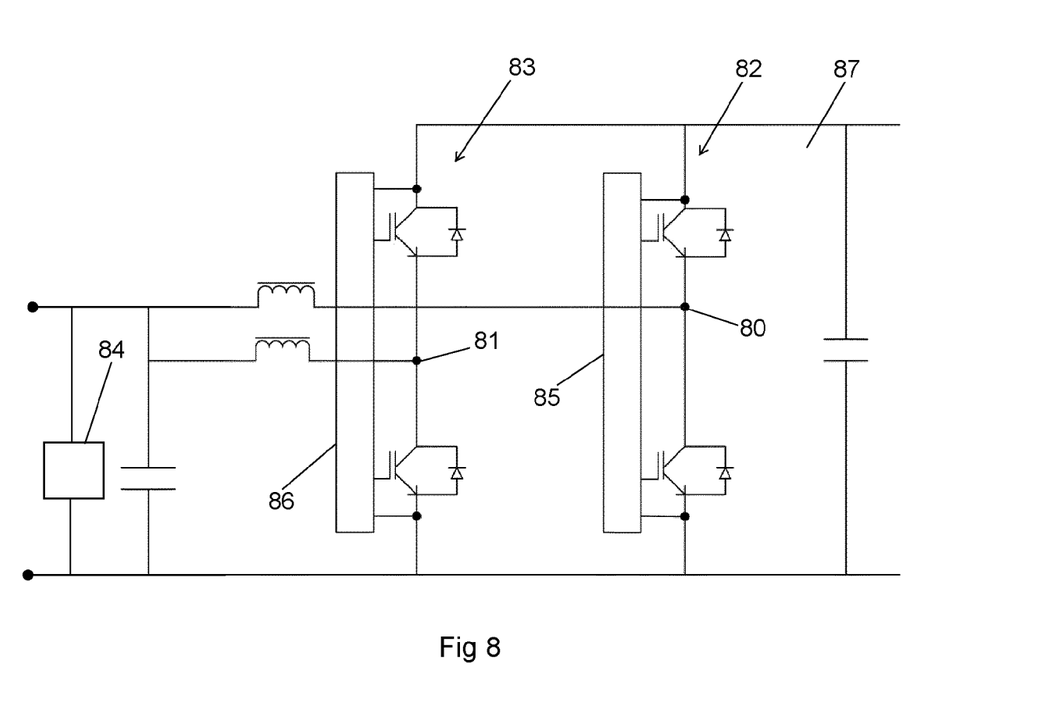
FIG. 8 illustrates schematically an embodiment of a converter according to the invention in the form of a DC/DC converter.

The principles of voltage measuring disclosed with reference made to FIGS. 3 and 4, the possible faults described while making reference to FIG. 5 and the embodiments disclosed with reference made to FIGS. 6 and 7 are also applicable to the case of a converter according to the invention being a DC/DC converter and accordingly having a DC load/source on said second side as illustrated in FIG. 8. The midpoints 80, 81 of the half bridges 82, 83 are here connected to a DC load/source illustrated by a box 84 and each half bridge has a gate drive unit 85, 86 functioning as disclosed in connection with FIG. 3 and configured to send a digital signal representing a value of the DC voltage between the opposite poles on the first side 87 to a calculating unit not shown comprised in the converter as described above. Such a DC/DC converter may for instance be used for connecting traction batteries in a railway vehicle to a motor converter while adapting the level of the DC voltage to that required by the motor converter.

Figure 9:
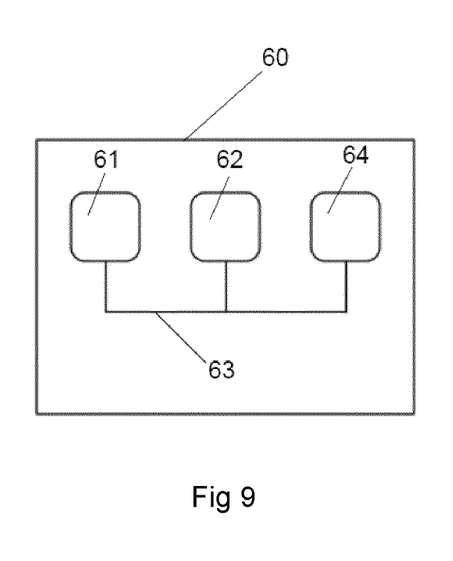
FIG. 9 is a schematic view illustrating an electronic converter control unit for implementing the invention.

Computer program code for implementing a method according to the invention is with advantage included in a computer program which can be read into the internal memory of a computer, e.g. the internal memory of an electronic converter control unit of a track-bound vehicle. Such a computer program is with advantage provided with a computer program product comprising a data storage medium which can be read by a computer and which has the computer program stored on it. FIG. 9 illustrates very schematically an electronic converter control unit 60 comprising an execution means 61, e.g. a central processor unit (CPU) for execution of computer software. The execution means 61 communicates with a memory 62, e.g. of the RAM type, via a data bus 63. The electronic converter control unit 60 also comprises a non-transitory data storage medium 64, e.g. in the form of a flash memory or a memory of the ROM, PROM, EPROM or EEPROM type. The execution means 61 communicates with the data storage medium 64 via the data bus 63. The computer program comprises computer program code for implementing a method according to the invention. Even better is to have the functions of the method for operating a voltage source converter completely performed by a Field-programmable gate array, an FPGA, having a plurality of parallel branches making it operating faster than a computer and the physical function of which may be changed by sending new programs thereto through a cable. Reference is made to WO 00/10243 showing such control.

The invention is of course in no way restricted to the embodiments described above, since many possibilities for modifications thereof are likely to be obvious to one skilled in the art without having to deviate from the scope of the invention defined in the appended claims.

Instead of digital signals from four gate drive units, such signals from two, three or any other plural number of gate drive units may be used to calculate a DC voltage value.

"The gate drive units are configured to send a digital signal to a calculating unit" is in this disclosure to be interpreted to also cover the case that the calculating unit is included in each gate drive unit.

The invention claimed is:
1. A voltage source converter comprising
at least two half bridges each having two current valves connected in series and configured to be connected to opposite poles of a DC source/load on a first side of the converter, each said current valve comprising a semi- conductor device of turn-off type and a rectifying diode connected in anti-parallel therewith, a midpoint of the half bridge between the two current valves being configured to be connected to one of a) an AC load/source and b) a DC load/source on a second side of the converter, for each half bridge a gate drive unit having two gate drive members each comprising a logic device and a gate drive stage configured to control the semiconductor device of a current valve each to turn on and off according to control signals from a converter control device, and a said converter control device configured to send control signals to said gate drive members for controlling the operation of the converter according to a Pulse Width Modulation pattern for creating for a) on said second side an AC fundamental voltage and current and for b) on said second side a DC voltage and current, each gate drive unit including an arrangement configured to carry out voltage measurements for providing a value of the DC voltage between said opposite poles to be used by the converter control device to calculate control signals to be sent to the gate drive units, each said arrangement comprising a voltage divider connected across the two current valves of the respective half bridge so as to measure the entire DC voltage between said opposite poles, each voltage divider having an output connected to processing parts delivering a digital signal representing a value of the DC voltage between said opposite poles, wherein at least two said gate drive units are configured to send a said digital signal to a calculating unit comprised in the converter, and that the calculating unit is configured to carry out a quality estimation of the digital signals received from these at least two gate drive units so as to give them an individual quality value and to calculate a said DC voltage value to be used by the converter control device from these signals while giving each signal a weight corresponding to the quality value adhered thereto and forming a weighted average value.

2. A voltage source converter according to claim 1, wherein the calculating unit is configured to carry out said quality estimation by forming a time differential variable of each individual said digital signal and giving it a quality value being the lower the higher the absolute value of this differential variable is.

3. A voltage source converter according to claim 2, wherein the calculating unit is configured to compare each said absolute value with a predetermined value and give the digital signal associated with that absolute value a zero weight when said absolute value exceeds said predetermined value and then not consider this digital signal when calculating said DC voltage value.

4. A voltage source converter according to claim 1, wherein it comprises at least three said half bridges with gate drive units configured to send a said digital signal representing a value of the DC voltage between said opposite poles to the calculating unit, and that the calculating unit is configured to carry out said quality estimation by first forming a mean value of the digital signals from these at least three gate drive units, then compare the value of each signal with said mean value and finally give each signal a quality value and by that a weight when combining the signals depending upon the magnitude of the difference of the value of the signal and said mean value.

5. A voltage source converter according to claim 1, wherein the second side is an AC side and that the converter comprises three said half bridges each having a said gate drive unit configured to create a three phase AC fundamental voltage and current on said AC side.

6. A voltage source converter according to claim 1, wherein said calculating unit comprises a neural network trained with said digital signals from said gate drive units while comparing them with a true DC voltage measured between said opposite poles during a training phase of the converter before operation thereof, and that the calculating unit is configured to use an algorithm of the trained network to determine a said individual quality value of each said digital signal for the calculation of said DC voltage value by combining said digital signals.

7. A voltage source converter according to claim 1, wherein it comprises a said half bridge having a resistor connected in parallel with one of the valves so as to act as a brake chopper, and that the calculating unit is configured to involve the digital signal delivered by the gate drive unit of this half bridge when calculating said DC voltage value.

8. A voltage source converter according to claim 1, wherein it comprises a DC voltage sensor connected to the two poles of said DC source/load for measuring the DC voltage between these poles, and that the converter comprises a member configured to compare the DC voltage value calculated by the calculating unit with data of the DC voltage sensor so as to detect malfunction of said sensor.

9. A voltage source converter according to claim 1, wherein the calculating unit is included in the converter control device.

10. A voltage source converter according to claim 1, wherein the semiconductor devices of the current valves are IGBTs (Insulated Gate Bipolar Transistors) or MOSFETs (Metal Oxide Semiconductor Field Effect Transistors).

11. A track-bound vehicle having at least one converter according to claim 1.

12. A method of operating a voltage source converter comprising at least two half bridges each having two current valves connected in series and configured to be connected to opposite poles of a DC source/load on a first side of the converter, each said current valve comprising a semiconductor device of turn-off type and a rectifying diode connected in anti-parallel therewith, a midpoint of the half bridge between the two current valves being configured to be connected to one of a) an AC load/source and b) a DC load/source on a second side of the converter, for each half bridge a gate drive unit having two gate drive members each comprising a logic device and a gate drive stage configured to control the semiconductor device of a current valve each to turn on and off according to control signals from a converter control device and a said converter control device configured to send control signals to said gate drive members for controlling the operation of the converter according to a Pulse Width Modulation pattern for creating for a) on said second side an AC fundamental voltage and current and for b) on said second side a DC voltage and current, each gate drive unit including an arrangement configured to carry out voltage measurements for providing a value of the DC voltage between said opposite poles to be used by the converter control device to calculate and send control signals to the gate drive units, each said arrangement comprising a voltage divider connected across the two current valves of the respective half bridge so as to measure the entire DC voltage between said opposite poles, the method comprising the steps:

a) carrying out measurements of the entire DC voltage between said opposite poles for each said gate drive unit, and b) processing results from said measurements and by that for each said gate drive unit delivering a digital signal representing a value of the DC voltage between said opposite poles, c) carrying out a quality estimation of said digital signals delivered by at least two said gate drive units while giving each of these signals an individual quality value, and d) calculating a said DC voltage value to be used by the converter control device from these signals subjected to the quality estimation while giving each signal a weight corresponding to the quality value adhered thereto and forming a weighted average value.

13. A method according to claim 12, wherein it is carried out for a voltage source converter (12) comprising a DC voltage sensor configured to be connected to the two poles of said DC source/load for measuring the DC voltage between these poles, and that the method comprises a further step e) of comparing the DC voltage value calculated in step d) with data of the DC voltage sensor and by that determining the functionality of said sensor and to detect malfunction of said sensor.

14. A firmwave product adapted for storing in a non-transitory data storage medium which can be read by a Field-programmable gate array (FPGA) and which causes said FPGA to implement a method according to claim 12 or a computer program product comprising a non-transitory data storage medium which can be read by a computer and on which a computer program is stored which comprises computer program code for causing a computer to implement a method according to any of claim 12 or 13 when the computer program is executed by a computer.

15. An electronic converter control unit comprising an execution means, a memory connected to the execution means and a non-transitory data storage medium which is connected to the execution means and on which the computer program code of a computer program according to claim 14 is stored.

* * * * *